(12) United States Patent
Amano et al.

(10) Patent No.: US 7,290,908 B2
(45) Date of Patent: Nov. 6, 2007

(54) VEHICULAR LAMP

(75) Inventors: Yasuyuki Amano, Shizuoka (JP); Tsutomu Machida, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 11/497,043

(22) Filed: Aug. 1, 2006

(65) Prior Publication Data

US 2007/0030688 A1 Feb. 8, 2007

(30) Foreign Application Priority Data

Aug. 5, 2005 (JP) .............................. 2005-228520

(51) Int. Cl.
*F21V 5/00* (2006.01)
(52) U.S. Cl. ...................... 362/520; 362/521; 362/522; 362/330
(58) Field of Classification Search ................ 362/330, 362/334, 337, 520, 521, 522
See application file for complete search history.

(56) References Cited

U.S. PATENT DOCUMENTS 6,340,239 B1 * 1/2002 Godbillon et al. .......... 362/521

6,796,695 B2    9/2004  Natsume

FOREIGN PATENT DOCUMENTS

JP    61-253703    11/1986

* cited by examiner

*Primary Examiner*—Stephen F. Husar
(74) *Attorney, Agent, or Firm*—Koda & Androlia

(57) ABSTRACT

A vehicular lamp including a light-emitting element 10 that emits light at a greater diffusion angle in the lateral direction than in the vertical direction, thus enabling the light to be incident on the rear face 34*a* of a horizontally elongated inner lens 34 with high efficiency. The rear face 34*a* has a cylindrical surface that extends in the lateral direction, and the curvature of a convex curve, which forms the cross-sectional shape of the cylindrical surface taken along the vertical plane parallel to the optical axis Ax, gradually reduces according to the increase in the distance from the optical axis Ax in the lateral direction, thus allowing the curvature of the convex curve to be maintained at a substantially constant value in the lateral direction and further preventing the diffusion angle of the light into the lens in the vertical direction from increasing in the lateral direction.

4 Claims, 12 Drawing Sheets

VEHICULAR LAMP

BACKGROUND OF THE INVENTION

1. Field of the Invention

The present invention relates to a vehicular lamp that includes a light-emitting element such as a light-emitting diode or the like as its light source.

2. Description of the Related Art

In recent years, vehicular lamps that employ a light-emitting element such as a light-emitting diode or the like as its light source have been used commonly.

For example, Japanese Patent Application Laid-Open (Kokai) No. 61-253703 discloses a vehicular lamp that includes a light-emitting diode disposed to face forward with a lens disposed in front of the light-emitting diode. U.S. Pat. No. 6,796,695 discloses a horizontally elongated vehicular lamp having a narrow (small) width in a vertical direction; and in this lamp, the light emitted from the light-emitting diode is reflected toward the front side by a reflector.

In many cases, vehicular lamps that employ light-emitting elements as the light source have a horizontally long shape with a narrow (small) vertical width as disclosed in the above-described U.S. Pat. No. 6,796,695.

In one example of such a horizontally elongated vehicular lamp, the light emitted from a light-emitting element is controlled by a lens disposed in front of the light-emitting element as disclosed in Japanese Patent Application Laid-Open (Kokai) No. 61-253703, and a horizontally elongated lens has a rear face formed in a shape of a cylinder that extends in the lateral direction.

However, in such a vehicular lamp, the convex curve, which forms the cross-sectional shape of the cylindrical surface taken along a vertical plane that passes through the light emission center of the light-emitting element, has a curvature that increases according to the increase in the divergence angle centered on the optical axis in the lateral direction. This causes a difference in the degree of deflection of the light incident on the lens in the vertical direction between the center portion of the lens and a portion near each of both edges.

Accordingly, even in a case that the diffusion angle in the vertical direction is set to be a suitable value (e.g., 0°) for the light incident on the center portion of the lens, the diffusion angle in the vertical direction is significantly greater than the suitable value for the light incident on a portion near each of both ends. This causes a problem that the portion near each of both ends of the lens appears dark while the center of the lens appears bright.

Furthermore, in a horizontally elongated lens, the divergence angle in the vertical direction for the light emitted from the light-emitting element decreases according to the increase of the divergence angle centered on the optical axis in the lateral direction. As a result, the portion near each of both ends of the lens tends to appear dark.

BRIEF SUMMARY OF THE INVENTION

Accordingly, the object of the present invention is to provide a vehicular lamp in which the light emitted from a light-emitting element is controlled by a horizontally elongated lens disposed in front of the light-emitting element, so the vehicular lamp provides substantially uniform luminance over the entire area of the lens.

In other words, in the present invention, the rear face of a horizontally elongated lens has a cylindrical surface that extends in the lateral direction, and the surface structure is improved in order to accomplish the above-described object.

More specifically, the above object is accomplished by a unique structure of the present invention for a vehicular lamp that includes a light-emitting element disposed to face forward on the optical axis which extends in the front-back direction of the vehicular lamp, and a horizontally elongated lens disposed in front of the light-emitting element; and in the present invention, the light-emitting element directs light with a divergence angle that is greater in the lateral direction than in the vertical direction; and the rear face of the lens is formed in a shape of a cylindrical surface that extends in the lateral direction of the lens, and a curvature of the convex curve, which forms the cross-sectional shape of the cylindrical surface taken along the vertical plane parallel to the optical axis, is set to gradually reduce according to the increase in the distance from the optical axis in the lateral direction of the lens.

The type of the "vehicular lamp" described above is not particularly restricted. Examples of vehicular lamps to which the present invention can be applied include a head lamp, fog lamp, cornering lamp, tail lamp, stop lamp, reserving lamp, turning signal lamp, daytime running lamp, etc.

The above-described "optical axis" may or may not be the axis extending in the front-back direction of a vehicle as long as the optical axis is in the front-back direction of the lamp.

In addition, the above-described "light-emitting element" represents a light source provided in the form of an element having a light-emitting chip that has the function of emitting light in a substantially pin-point manner. The kind of the light-emitting element is not particularly restricted. The light-emitting elements include, for example, light-emitting diodes, laser diodes, etc.

The above-described "lens" is not particularly restricted as long as the rear face is in the shape of a cylindrical surface that extends in the lateral direction.

Furthermore, the "horizontally elongated lens" in above description represents a lens with its horizontal width two or more times greater than the vertical width. The specific outer shape thereof is not particularly restricted.

Furthermore, the specific shape of the above-described "convex curve" is not particularly restricted. Examples of shapes employable in the present invention include arcs, etc.

As seen from the above, in the vehicular lamp according to the present invention, a light-emitting element is provided so that it faces forward on the optical axis that extends in the front-back direction of the lamp, and a horizontally elongated lens is provided in front of the light-emitting element. In this construction, the light-emitting element is configured so that it emits light at a greater divergence angle in the lateral direction than in the vertical direction. Furthermore, the rear face of the lens is in the shape of a cylindrical surface that extends in the lateral direction. Here, the curvature of the convex curve, which forms the cross-sectional shape of the cylindrical surface as taken along a vertical plane parallel to the optical axis, is set to gradually decrease according to the increase in the distance from the optical axis in the lateral direction. Such an arrangement provides the advantages below.

The light-emitting element is configured so that light is emitted at a greater divergence angle in the lateral direction than in the vertical direction. As a result, light emitted from the light-emitting element is incident on the rear face of the horizontally elongated lens with high efficiency.

Furthermore, the rear face of the lens has a cylindrical surface that extends in the lateral direction. Here, the curvature of the convex curve, which forms the cross-sectional shape of the cylindrical surface as taken along the vertical plane parallel to the optical axis, gradually reduces according to the increase in the distance from the optical axis in the lateral direction. As a result, the curvature of the convex curve, which forms the cross-sectional shape of the cylindrical surface taken along a vertical plane that passes through the light emission center O of the light-emitting element, can be maintained at substantially the constant value even in a case of light emission over a large divergence angle centered on the optical axis in the lateral direction.

With respect to the light incident on the lens, the diffusion angle in the vertical direction is prevented from increasing according to the increase in the divergence angle centered on the optical axis in the lateral direction, and this setting prevents the occurrence of a situation that the portion near each of both ends of the lens appears dark while the center of the lens appears bright when viewed from the front.

As described above, the present invention provides a vehicular lamp that controls the light emitted from the light-emitting element by a horizontally elongated lens provided in front of the light-emitting element, and it functions to provide substantially uniform luminance over the entire area of the lens.

In the present invention, the cross-sectional shape of the cylindrical surface, which forms the rear face of the lens as taken along the horizontal plane, can be formed in the shape of a letter-V that extends forward according to the increase of the distance from the optical axis in the lateral direction of the lens. With this arrangement, light emitted from the light-emitting element can be greatly refracted by the rear face of the lens so that it is deflected toward the optical axis; and the light directed from the front face of the lens can be easily controlled.

Furthermore, in the present invention, the lens can be provided with multiple prism-shaped lens elements on the front face so that each of the lens elements deflects and directs the light from the light-emitting element which is incident on the lens toward the optical axis with respect to the lateral direction of the lens. As a result, it is possible to make a high-precision control on the light directed from the front face of the lens.

BRIEF DESCRIPTION OF THE SEVERAL VIEWS OF THE DRAWINGS

FIGS. 9A and 9B are diagrams showing the luminance distribution of the light-emitting chip in a horizontal plane that includes the optical axis, in which FIG. 9A shows a luminance distribution of the light emitted from the light-emitting chip, and FIG. 9B shows a luminance distribution of the light directed from the curved surface portion of a sealing member;

DETAILED DESCRIPTION OF THE INVENTION

Embodiments of the present invention will be described below with reference to the accompanying drawings.

Figure 1:
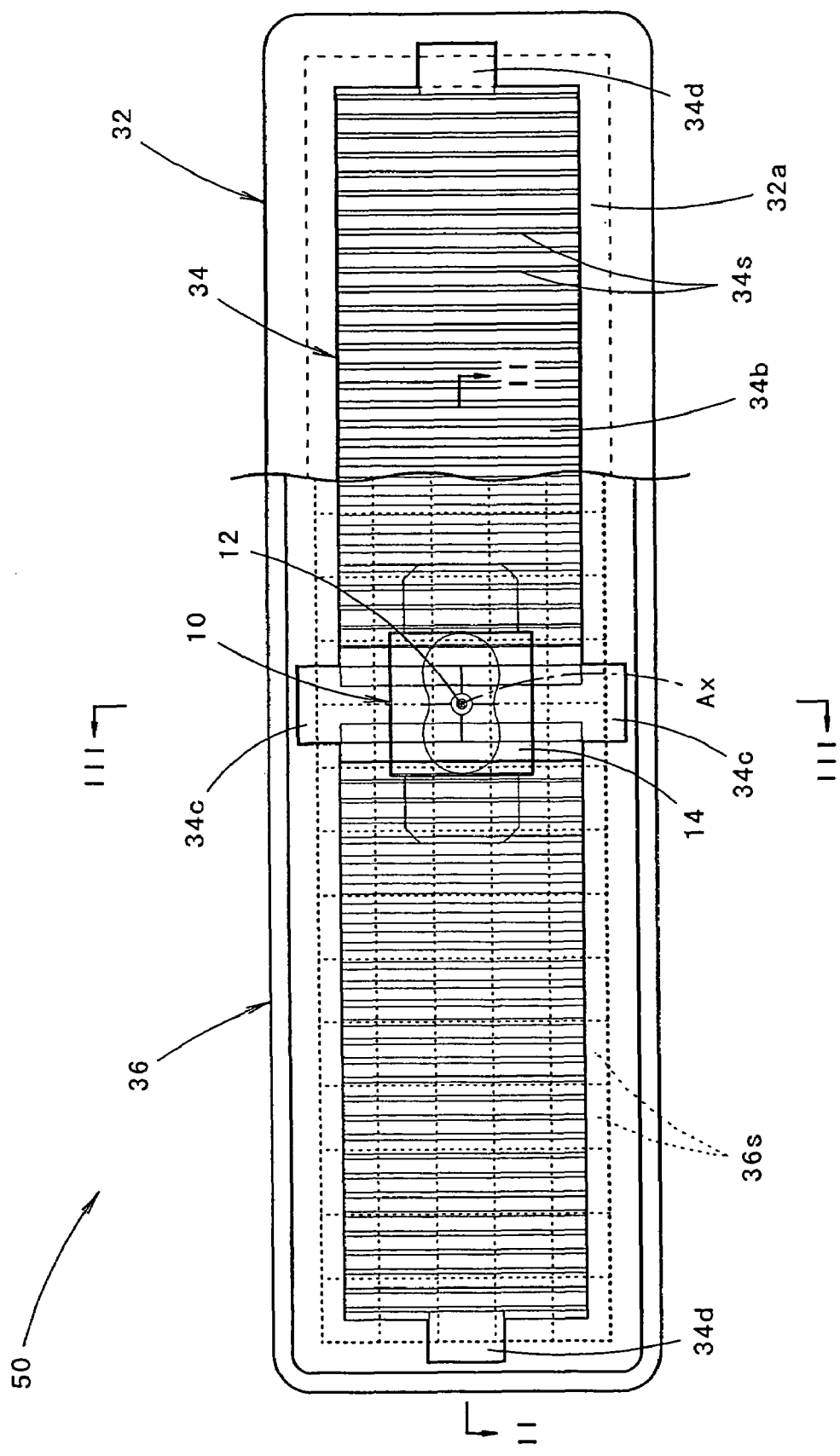
FIG. 1 is a front view of the vehicular lamp according to one embodiment of the present invention.
Figure 2:
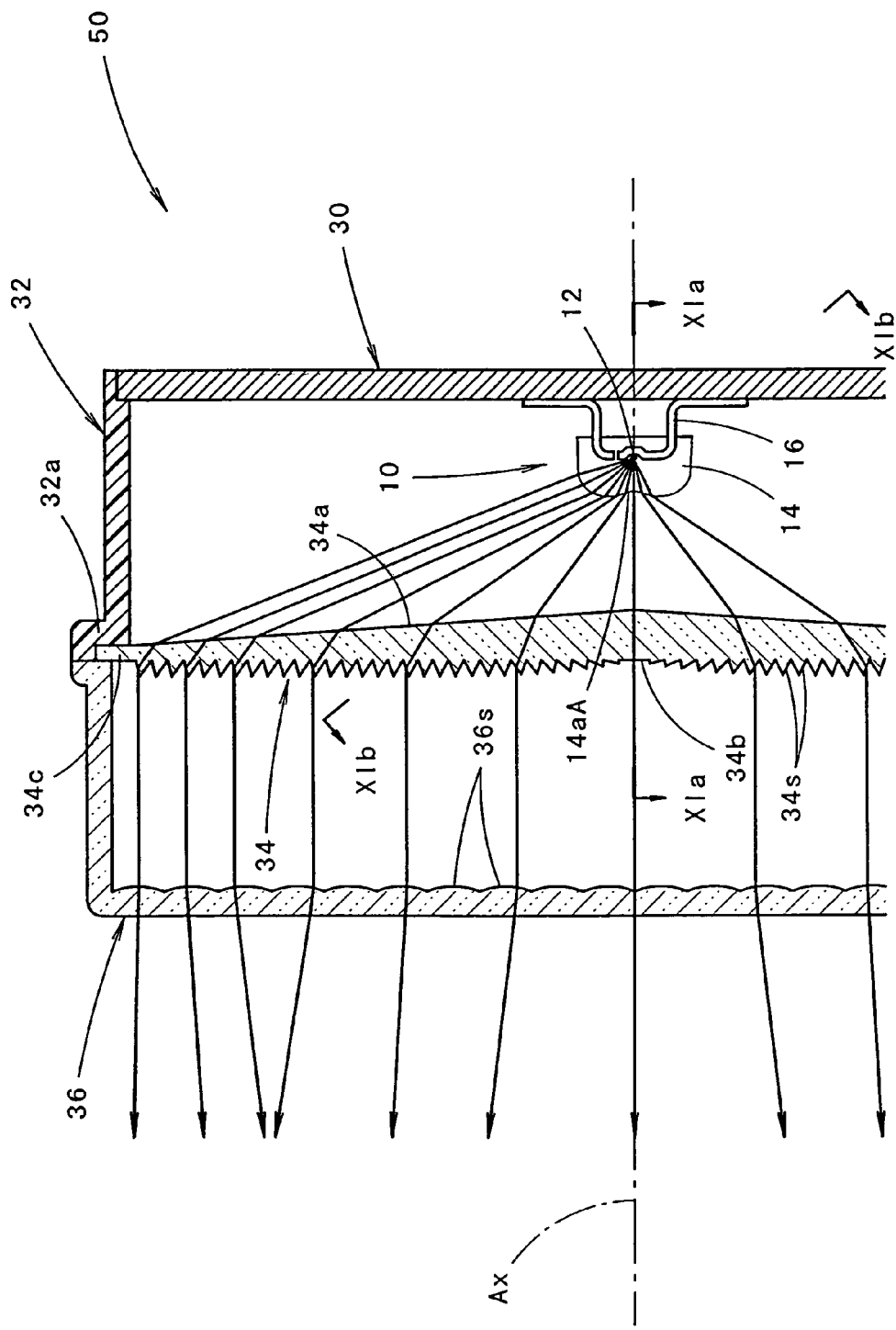
FIG. 2 is a cross-sectional view taken along the line II-II in FIG. 1.
Figure 3:
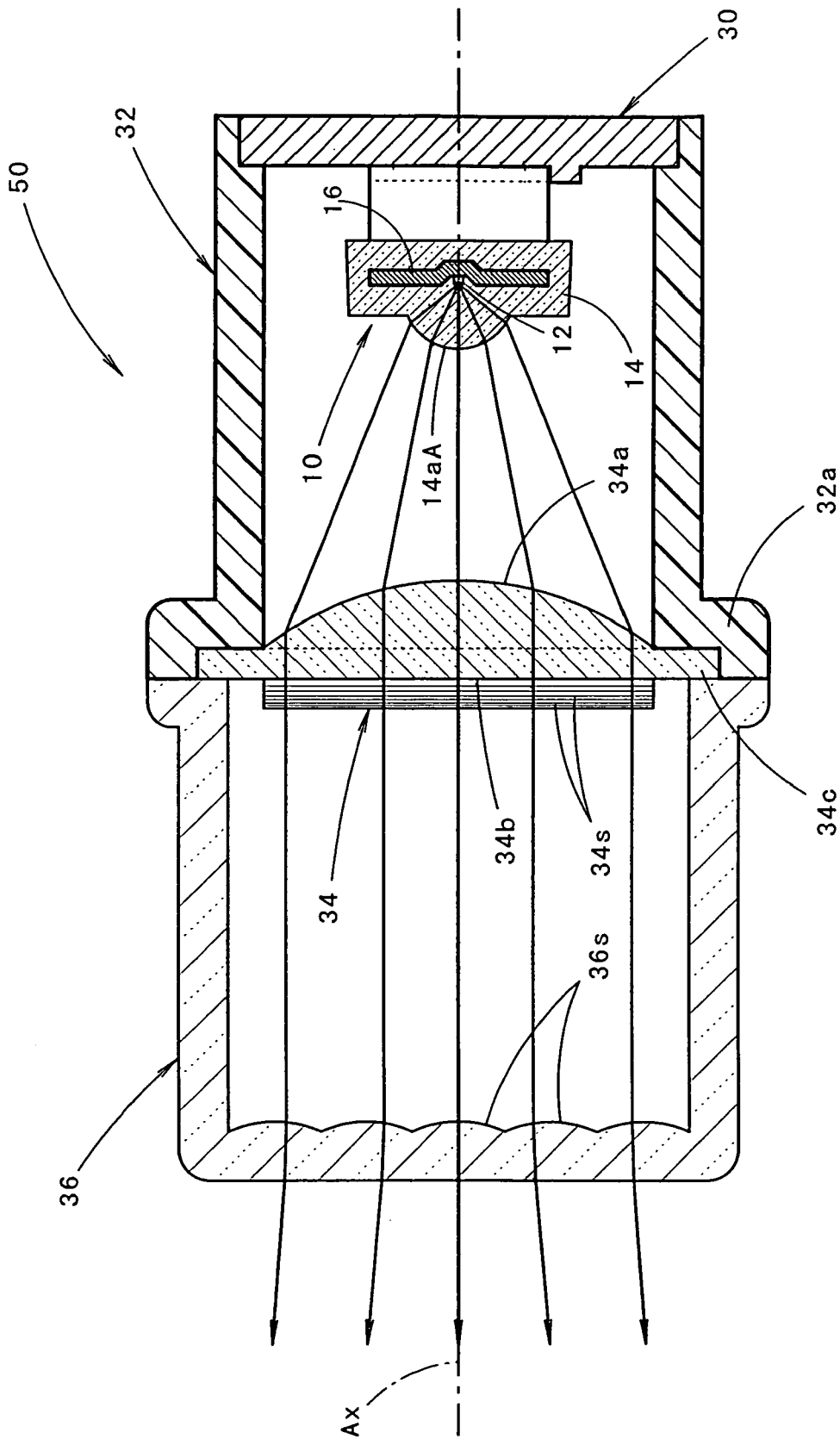
FIG. 3 is a cross-sectional view taken along the line III-III in FIG. 1.

FIG. 1 is a front view of the vehicular lamp 50 according to an embodiment of the present invention. FIG. 2 and FIG. 3 are the cross-sectional views taken along the line II-II and line III-III in FIG. 1, respectively.

As shown in FIGS. 1 through 3, the vehicular lamp 50 is a clearance lamp or the like that uses a light-emitting element 10 as the light source. The vehicular lamp 50 comprises a support board 30 for supporting and fixing the light-emitting element 10 disposed on the optical axis Ax extending in the front-back direction of the vehicular lamp so that it faces forward, a polygonal lamp body 32 for fixing the support board 30 at the perimeter, an inner lens 34 fixed at the front end opening 32a of the lamp body 32, and an outer lens 36 fixed to the lamp body 32 with the inner lens 34 pressed in contact with the front end opening 32a of the lamp body 32.

The vehicular lamp 50 has an outer shape of a horizontally long rectangle having a smaller vertical width (height) when viewed from the front. More specifically, the horizontal width of the vehicular lamp 50 is set to be around four times greater than the vertical width (height). Thus, the support board 30, the inner lens 34 and the outer lens 36 are accordingly in a shape of a horizontally long rectangle. The lamp body 32 has a polygonal shape that is rectangular in cross-section along the vertical plane orthogonal to the optical axis Ax.

First, the configuration of the light-emitting element 10 will be described.

Figure 4:
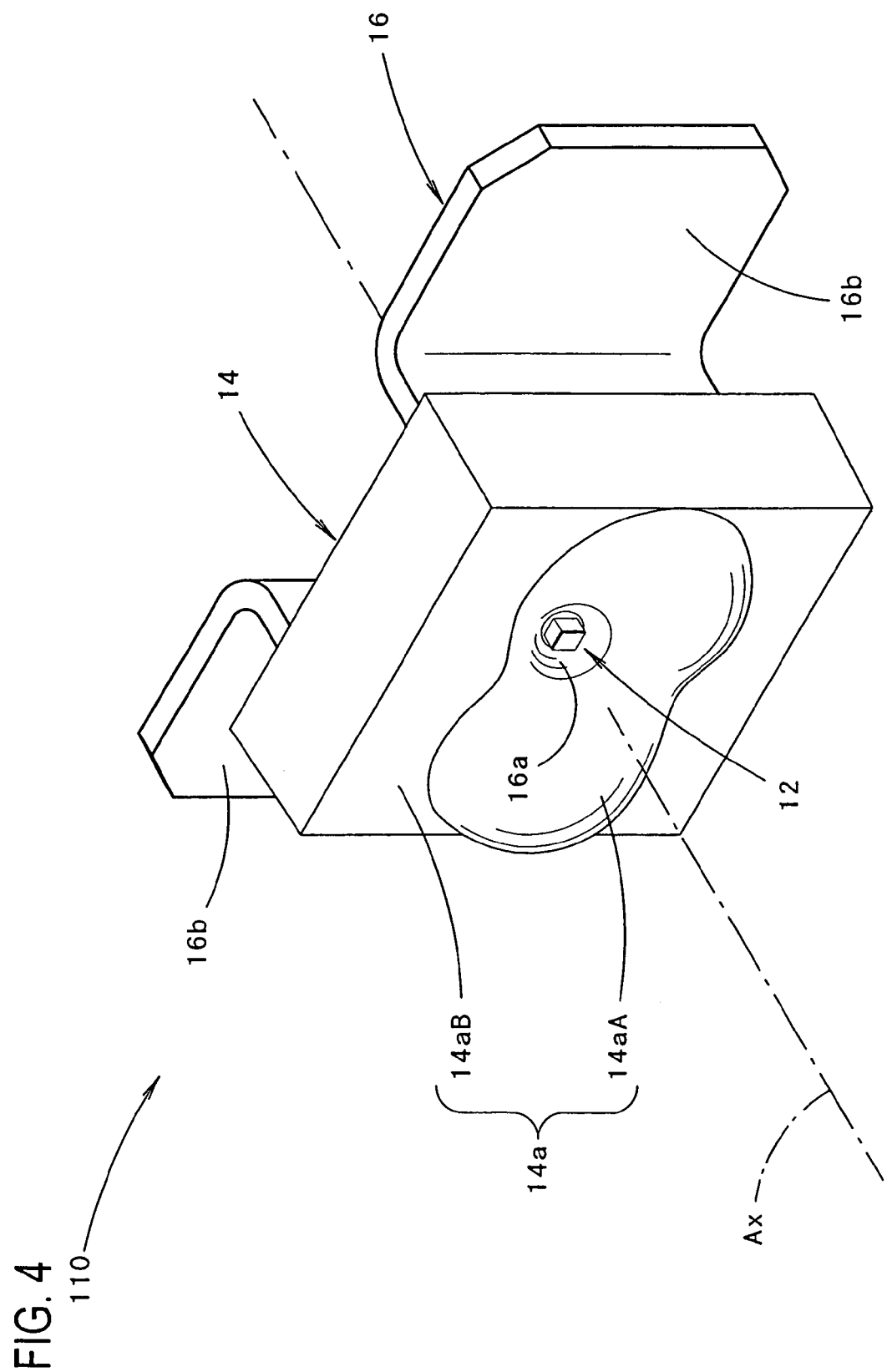
FIG. 4 is a perspective view of the light-emitting element employed as a light source of the vehicular lamp of the embodiment.
Figure 5:
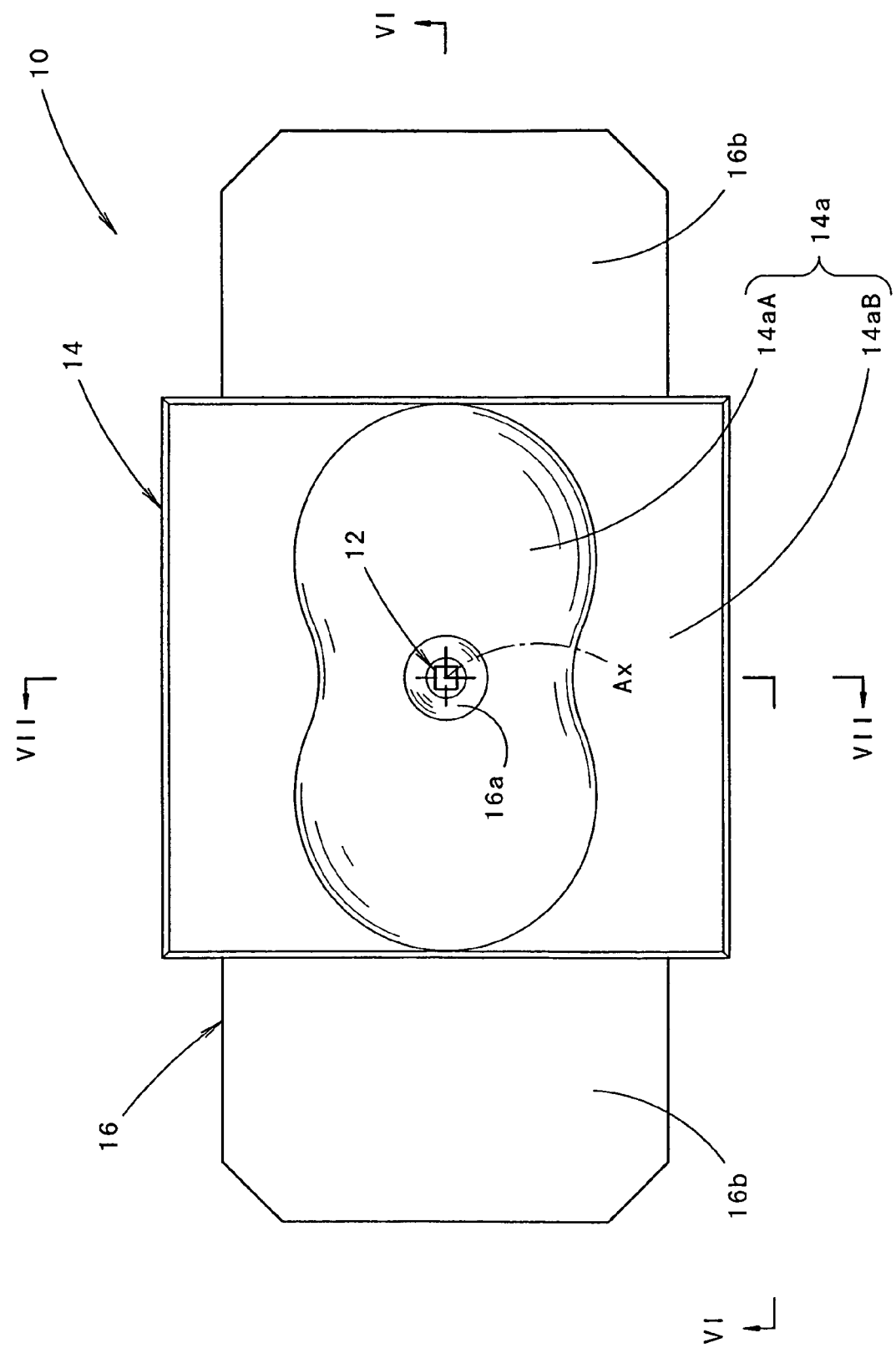
FIG. 5 is a front view of the light-emitting element.
Figure 6:
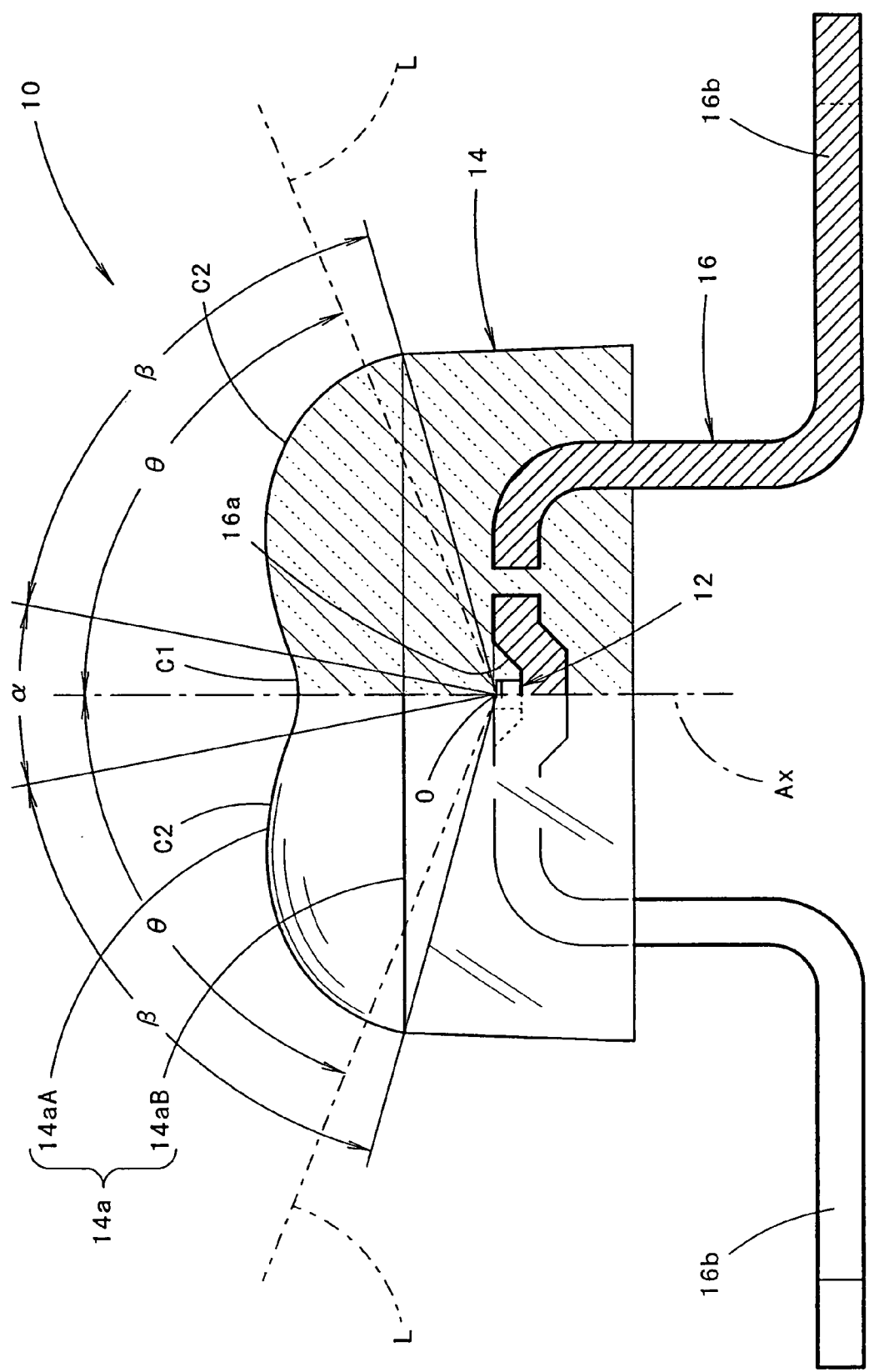
FIG. 6 is a cross-sectional view taken along the line VI-VI in FIG. 5.
Figure 7:
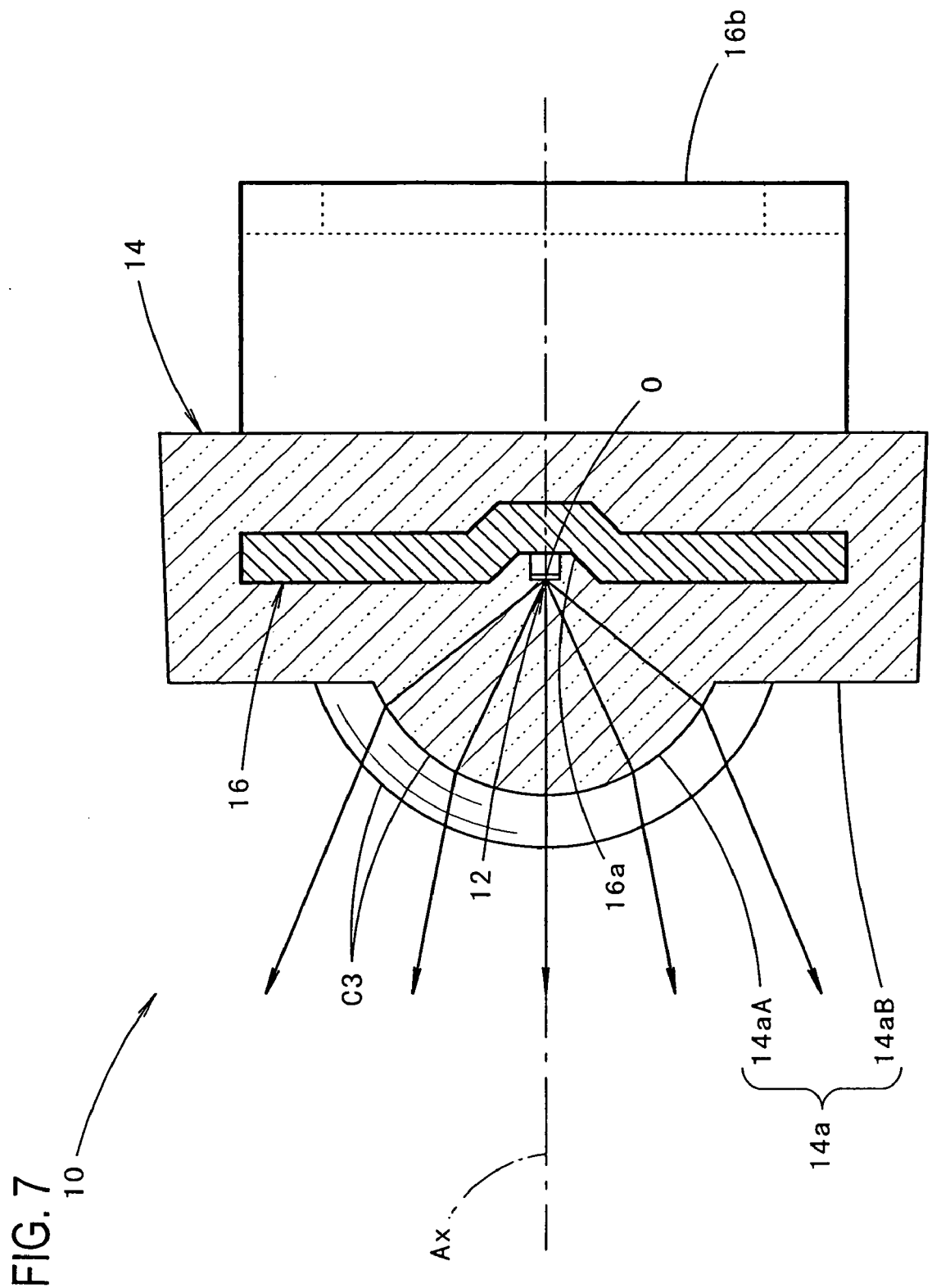
FIG. 7 is a cross-sectional view taken along the line VII-VII in FIG. 5.

FIG. 4 is a perspective view of the light-emitting element 10, and FIG. 5 is a front view thereof. FIG. 6 and FIG. 7 are cross-sectional views taken along the line VI-VI and line VII-VII in FIG. 5, respectively.

As seen from FIGS. 4 through 7, the light-emitting element 10 is comprised of a light-emitting chip 12, a transparent sealing member 14 for sealing the light-emitting chip 12 on the side that faces the forward direction, and a lead frame 16 for supporting the light-emitting chip 12.

The light-emitting chip 12 has a light emitting face of around 0.3 to 1 mm square, and it is disposed with its light emission center O positioned on the optical axis Ax and with its light emitting face facing forward.

The sealing member 14 is made of a transparent resin such as epoxy resin or the like and is formed square in its outer shape when viewed from the front. The depth of the sealing member 14 is about half the length of one side of its square shape. The sealing member 14 seals the light-emitting chip 12 and a part of the lead frame 16, so that the sealing member 14 wraps around the rear face of the light-emitting chip 12.

The front face 14a of the sealing member 14 has a flat surface portion 14aB, which is formed along the vertical plane orthogonal to the optical axis Ax, and a curved surface portion 14aA, which is formed in the shape of two humps that protrude forward from the flat surface portion 14aB.

As shown in FIG. 6, the cross-sectional shape of the curved surface portion 14aA taken along the horizontal plane that includes the optical axis Ax has an undulating curve that includes a concave curve C1 positioned near the optical axis Ax and convex curves C2 on both left and right sides of the concave curve C1.

The shape of this undulating curve is bilaterally symmetrical with respect to the optical axis Ax. The concave curve C1 is formed over the range of a central angle in an angle range of around 15 to 25° (e.g., around 20°) with the light emission center O of the light-emitting chip 12 as a reference point. Each of the convex curves C2 is formed over the range of the above-described central angle in an angle range of around 60 to 70° (e.g., around 65°).

As seen from FIG. 6, the concave curve C1 is formed in the shape of an arc that has a relatively large curvature. On the other hand, each of the convex curves C2 has a gradually changing curvature. More specifically, each of the convex curves C2 is formed so that it has the same curvature as the curvature of the concave curve C1 at positions at which the concave curve C1 is coupled with the convex curves C2, thus allowing the concave curve C1 and each of the convex curves C2 to be connected (continuous) to each another. Furthermore, each of the convex curves C2 has a curvature that gradually decreases according to the increase in the divergence angle centered on the optical axis Ax in the lateral direction. With such an arrangement, each of the curves C2 is formed so that its smallest curvature is at a position over the angle θ (direction denoted by the line of alternating long and short dashes L in FIG. 6) which is somewhat smaller than the far edge divergence angle (i.e., α/2+β). Furthermore, the arc of each of the curves C2 is formed with a constant curvature at the above-described divergence angle or more. The divergence angle θ is set to be around 65 to 75° (e.g., around 70°).

On the other hand, as shown in FIG. 7, the cross-sectional shape of the curved surface portion 14aA taken along a vertical plane, which is parallel to the optical axis Ax, is formed by a convex curve C3. The convex curve C3 is formed by an arc, which has its minimum radius on the optical axis Ax, and the radius of the convex curve C3 then gradually increases as the distance from the optical axis Ax increases in the lateral direction. The radius of the convex curve C3 then gradually decreases with a further increase in the distance from the optical axis Ax in the lateral direction. The center of the arc that forms the convex curve C3 is positioned somewhat forward with respect to the light emission center O of the light-emitting chip 12.

Since the horizontal cross-sectional shape and the vertical cross-sectional shape of the curved surface portion 14aA are formed by the curves as described above, the curved surface portion 14aA has a horizontally bilobal outer shape that has a transversely narrowed part at the middle portion in the longitudinal direction of the bilobal outer shape when viewed from the front.

The lead frame 16 has, as seen from FIG. 6, such a shape that it is formed by bending a belt-shaped metal plate into an inverted letter-U shape and then by further bending both ends thereof at right angles so as to extend in the directions opposite to one another. The light-emitting chip 12 is provided at the center of an upper level portion (or of the bottom of the U) of the lead frame 16. A cone-shaped recess 16a is formed at the center of the upper level portion of the lead frame 16, and the light-emitting chip 12 is provided at the center of the bottom of the recess 16a. As best seen from FIG. 8, the lead frame 16 is comprised of left and right separated parts, which are separated in the upper level portion. The light-emitting chip 12 is mounted on one of these separated parts (or on the left side part in FIG. 8), and bonding wires (not shown) that extend from the light-emitting chip 12 are connected to the other part (or to the right side part in FIG. 8). While the upper level portion of the lead frame 16 and the light-emitting chip 12 are sealed by the sealing member 14 as described above, a part of each of the pair of left and right terminals 16b of the lead frame 16 extends out of the sealing member 14.

Figure 8:
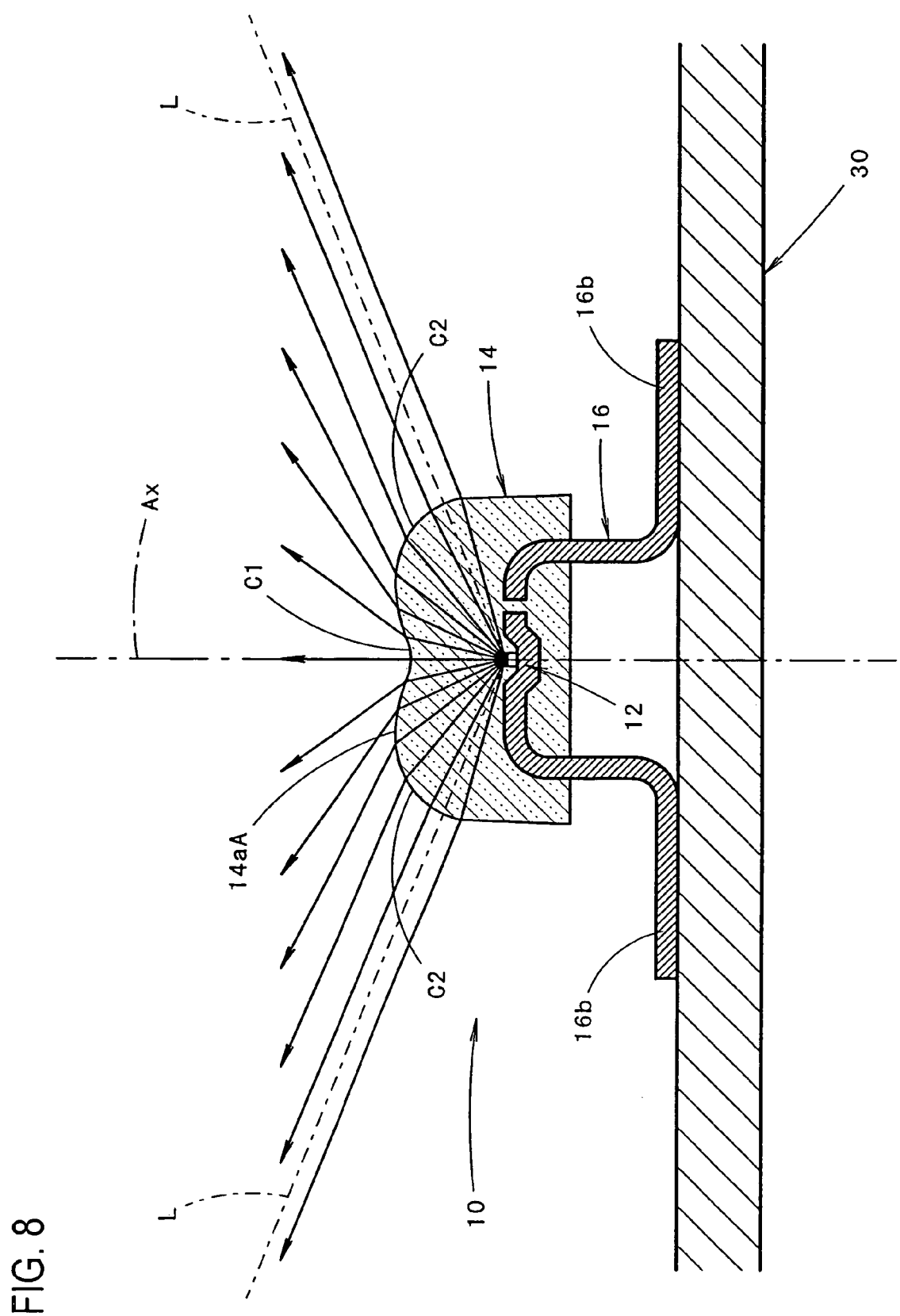
FIG. 8 is a plane (horizontal) cross-sectional view of the light-emitting element provided on a support board.

As shown in FIG. 8, the light-emitting element 10 is provided, at both terminals 16b of the lead frame 16, on the support board 30.

As seen from FIG. 8, a part of the light emitted by the light-emitting chip 12, which has been emitted at a small divergence angle centered on the optical axis Ax in the lateral direction in the horizontal plane that includes the optical axis Ax, reaches the area of the concave curve C1 of the curved surface portion 14aA. Accordingly, such light is directed forward and diffused so that it is distanced from the optical axis Ax by the light-diffusing function of the concave curve C1 of the curved surface portion 14aA. On the other hand, a part of the light emitted by the light-emitting chip 12, which has been emitted at a wide divergence angle centered on the optical axis Ax in the lateral direction, reaches the areas of the convex curves C2 of the curved surface portion 14aA. Accordingly, such light is directed forward so as to be deflected toward lines L positioned at the divergence angle θ with respect to the optical axis Ax by the light-condensing function of the convex curves C2 of the curved surface portion 14aA.

Figure 9B:
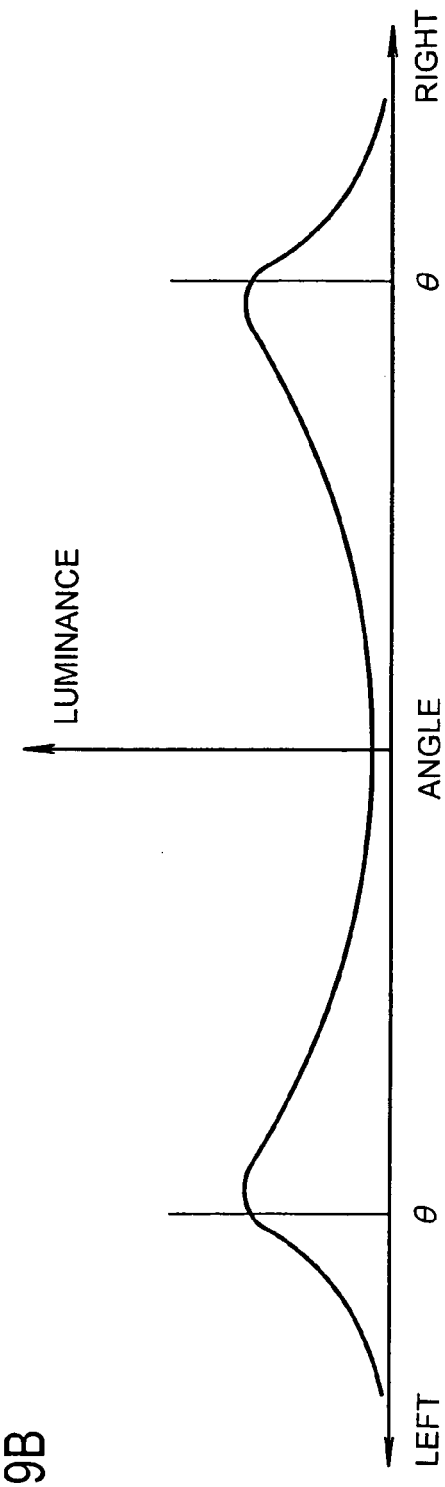
Figure 9A:
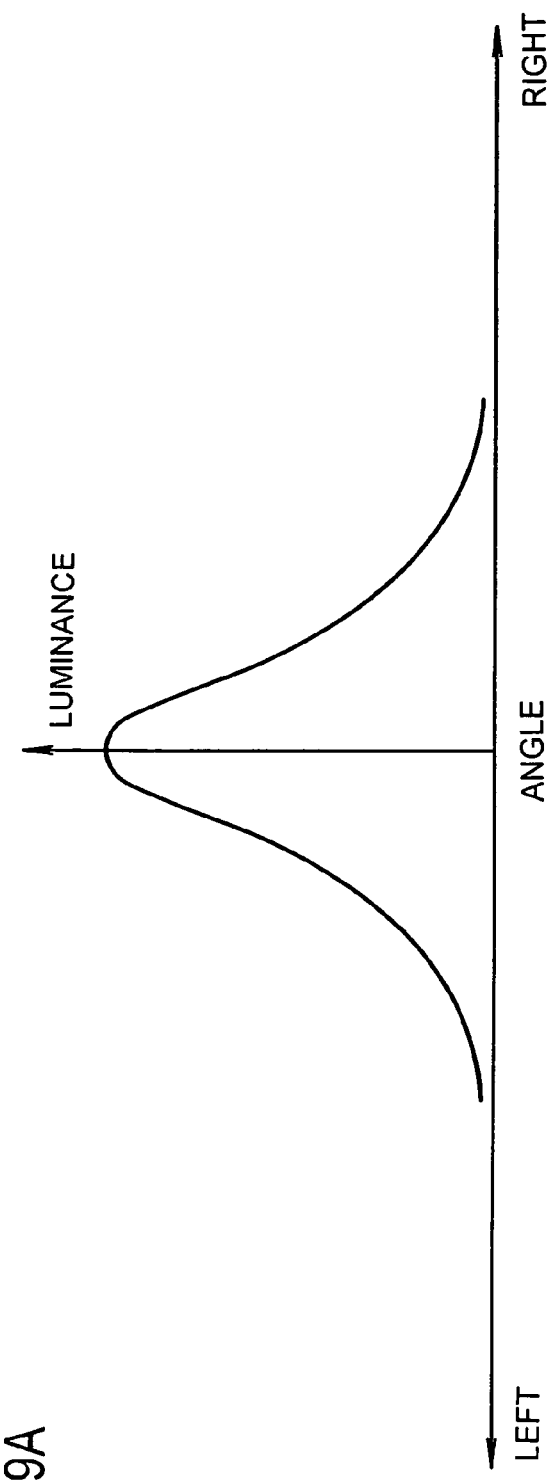

FIGS. 9A and 9B show the luminance distributions of the light-emitting chip 12 within the horizontal plane that includes the optical axis Ax. In particular, FIG. 9A shows the luminance distribution of the light emitted from the light-emitting chip 12. FIG. 9B shows the luminance distribution of the light directed from the curved surface portion 14aA of the sealing member 14 after the emission from the light-emitting chip 12.

As seen from FIG. 9A, the luminance distribution of the light emitted from the light-emitting chip 12 exhibits the maximum luminance on the optical axis Ax extending in the forward direction. Furthermore, it is a characteristic of this luminance distribution that the luminance rapidly decreases according to the increase in the divergence angle centered on the optical axis Ax. This is because the light-emitting chip 12 is disposed so that the light-emitting face faces forward.

On the other hand, as seen from FIG. 9B, the luminance distribution of the light directed from the curved surface portion 14aA of the sealing member 14 has a shape that is similar to a suspension bridge. In other words, it is a characteristic of this luminance distribution that the maximum luminance value appears in the direction over a divergence angle, which is somewhat smaller than the divergence angle θ, centered on the optical axis Ax in the lateral direction. Furthermore, in this luminance distribution, the luminance decreases according to the reduction in the divergence angle from the above-described divergence angle and exhibits its minimum value on the optical axis Ax. On the other hand, the luminance rapidly decreases according to the increase in the divergence angle beyond the divergence angle θ. This is because the cross-sectional shape of the curved surface portion 14aA, which is taken along the horizontal plane that includes the optical axis Ax, includes the undulating curve formed by the concave curve C1 positioned near the optical axis Ax and the convex curves C2 positioned on the left and right sides of the concave curve C1.

Furthermore, in the light-emitting element 10, the cross-sectional shape of the curved surface portion 14aA of the sealing member 14 taken along the vertical plane that is parallel to the optical axis Ax has the convex curve C3. Accordingly, the luminance distribution of the light emitted by the light-emitting chip 12 and directed from the curved surface portion 14aA of the sealing member 14 takes a luminance distribution that is created by concentrating the luminance distribution of the light, which has been emitted by the light-emitting chip 12, within a predetermined angle range of a small divergence angle centered on the optical axis in the vertical direction.

Furthermore, the light-emitting element 10 is formed so that the concave curve C1 and each of the convex curves C2 positioned on the left and right sides of the concave curve C1 (the concave curve C1 and the convex curves C2 forming the cross-sectional shape of the curved surface portion 14aA of the sealing member 14 taken along the horizontal plane that includes the optical axis Ax) are connected (or in continuous) smoothly to one another. Accordingly, the luminance distribution of the light which is directed from the curved surface portion 14aA of the sealing member 14 changes smoothly.

Next, the structure of the inner lens 34 will be described.

Figure 10:
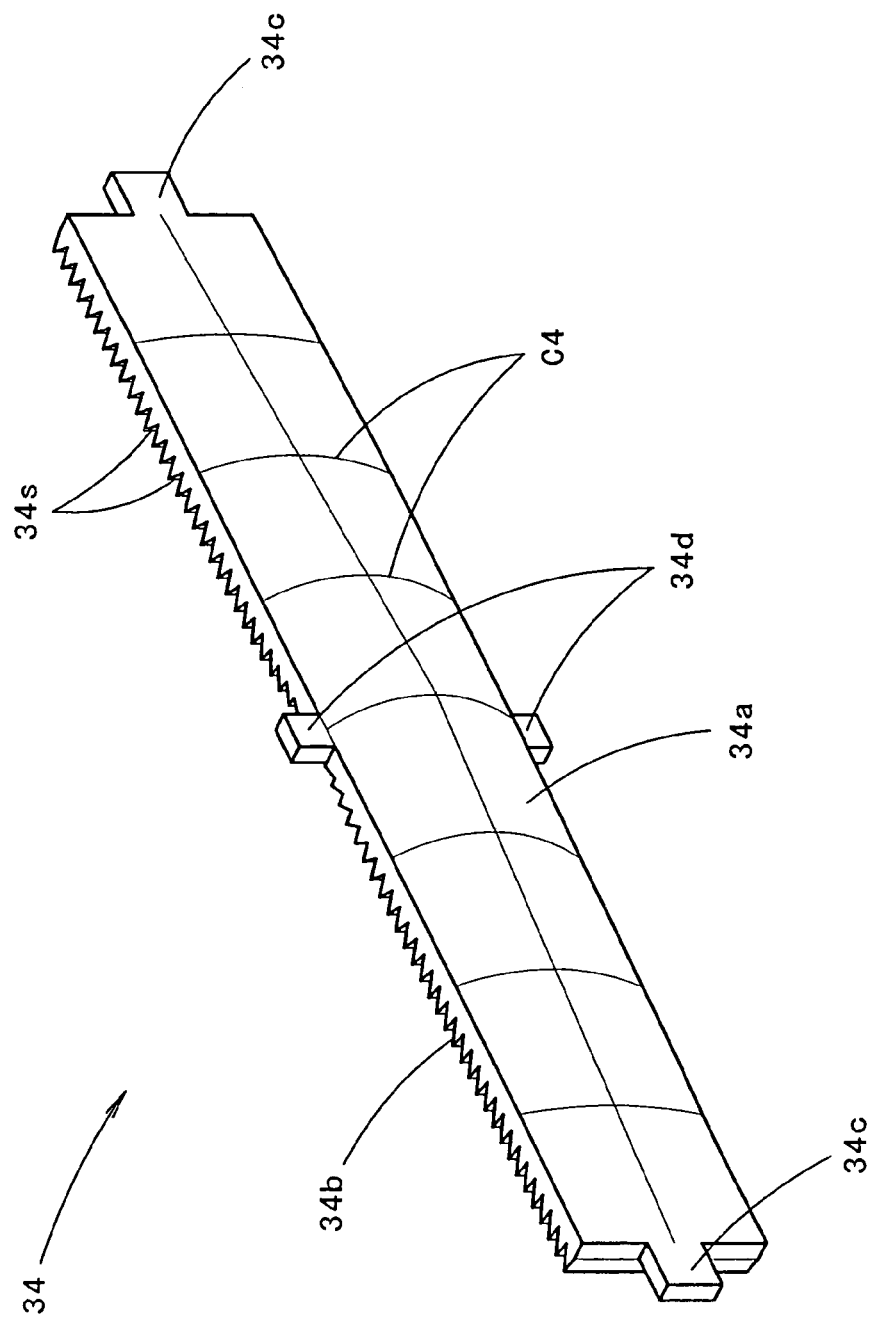
FIG. 10 is a perspective view of the inner lens employed in the vehicular lamp of the embodiment.

FIG. 10 is a perspective view of the inner lens 34. As seen from FIG. 10, the inner lens 4 is rectangular in shape with the longer side set horizontally, thus being a horizontally elongated lens.

As seen from FIG. 10, the rear face 34a of the inner lens 34 has a cylindrical surface that extends in its lateral direction. The convex curve C4, which forms the cross-sectional shape taken along each vertical plane parallel to the optical axis Ax, is formed by an arc having a predetermined curvature that gradually decreases according to the increase in the distance from the optical axis Ax in the lateral direction. Furthermore, the cross-sectional shape of the cylindrical face taken along the horizontal plane takes a V-shape that gradually extends forward according to the increase in the distance from the optical axis Ax in the lateral direction. In other words, as seen from FIG. 2, the rear face 34, which is of the inner lens 34 and is cylindrical as shown in FIG. 3, is formed to be gradually thinner towards the lateral ends of the inner lens 34 or according to the increase of the lateral distance from the center of the inner lens 34 or from the optical axis Ax.

Furthermore, the inner lens 34 has multiple prism-shaped lens elements 34s formed on the front face 34b in a shape of a stripe-shaped array having a sawtooth-shaped cross-sectional shape. The lens elements 34s cause the light incident on the inner lens 34 from the light-emitting element 10 to be deflected and directed in a direction closer to the optical axis Ax with respect to the lateral direction.

The inner lens 34 has a pair of lateral tabs 34c on the left and right sides of the outer edge and a pair of longitudinal tabs 34d on its upper and lower edges. The inner lens 34 is fixed to the lamp body 32 with the tabs 34c and 34d aligned with the front end opening 32a of the lamp body 32.

The inner lens 34 causes the light emitted from the light-emitting element 10 to be directed forward parallel to the optical axis Ax. A detailed configuration thereof will be described later.

As shown in FIG. 1 and FIG. 3, the outer lens 36 has multiple fisheye-lens-shaped diffusion lens elements 36s formed on the inner face. The diffusion lens elements 36s direct the light, which has been incident on the outer lens 36 from the inner lens 34 in the form of parallel light fluxes, forward from the outer lens 36 so that it is diffused in the vertical direction and the horizontal direction.

Figure 11A:
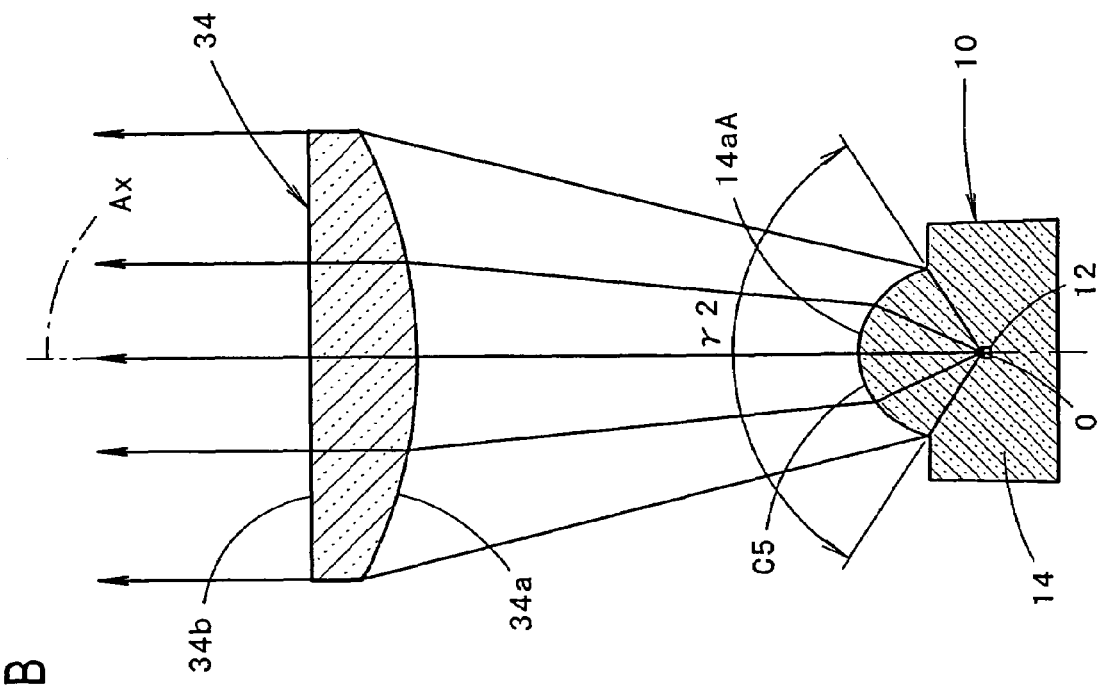
FIGS. 11A and 11B are cross-sectional views taken along the line XIa-XIa and line XIb-XIb in FIG. 2, respectively.
Figure 11B:
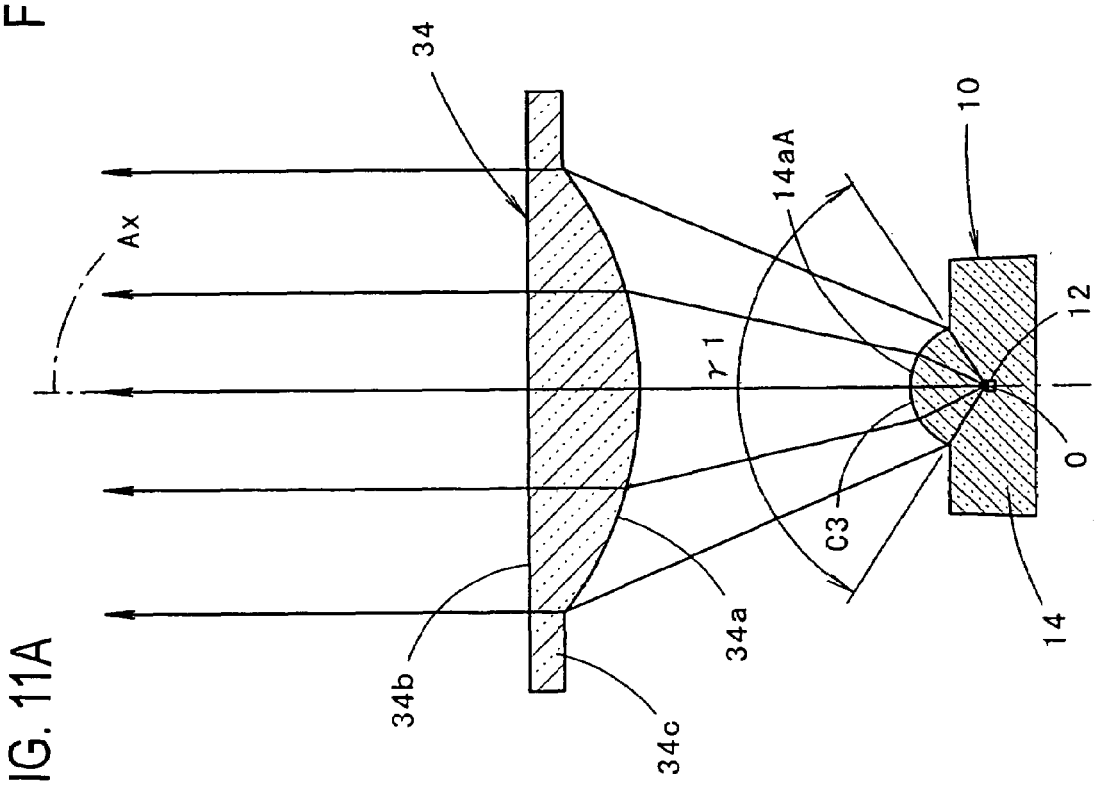

FIG. 11A shows a cross-sectional taken along the line XIa-XIa in FIG. 2, and FIG. 11B shows a cross-section taken along the line XIb-XIb in FIG. 2.

As seen from FIG. 11A, in the vertical plane that includes the optical axis Ax, the light, which has been emitted by the light-emitting chip 12 in the direction within the range of the angle γ1 centered on the optical axis Ax, is directed forward from the curved surface portion 14aA of the sealing member 14. On the other hand, as seen from FIG. 11B, in the vertical plane, which passes through the light emission center O of the light-emitting chip 12 and inclines in the lateral direction with respect to the optical axis Ax, the light, which has been emitted by the light-emitting chip 12 in the direction within the range of the angle γ2 centered on the optical axis Ax, is directed forward from the curved surface portion 14aA of the sealing member 14. The curved surface portion 14aA is formed in the shape of two humps so as to have a horizontally bilobal outer shape with a transversely narrowed part in the middle in the longitudinal direction of the bilobal outer shape when viewed from the front. Accordingly, the angles γ1 and γ2 are to be substantially the same value.

On the other hand, in the vertical plane shown in FIG. 11B, the convex curve C5, which forms the vertical cross-sectional shape of the curved surface portion 14aA of the sealing member 14, matches the shape obtained not only by simply enlarging the convex curve C3, which forms the vertical cross-sectional shape of the curved surface portion 14aA in the vertical plane shown in FIG. 11A, but also by slightly extending the convex curve C3 in the front-back direction. As a result, the refracting power is high with respect to the light emitted from the light-emitting chip 12. Accordingly, although the distance from the light-emitting element 10 to the inner lens 34 in the vertical plane shown in FIG. 11B is greater than that in the vertical plane shown in FIG. 11A, such light emitted from the light-emitting element 10 can reach the inner lens 34 without any loss.

Figure 12B:
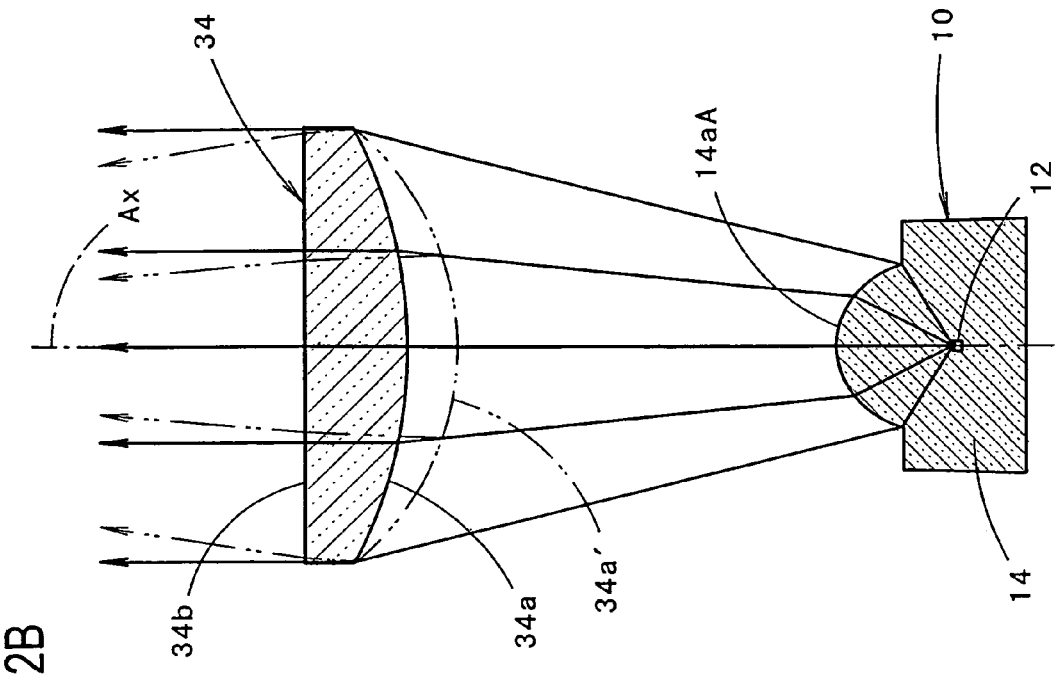
FIGS. 12A and 12B are diagrams showing, in the same way as in FIG. 11B, the functions of the embodiment.
Figure 12A:
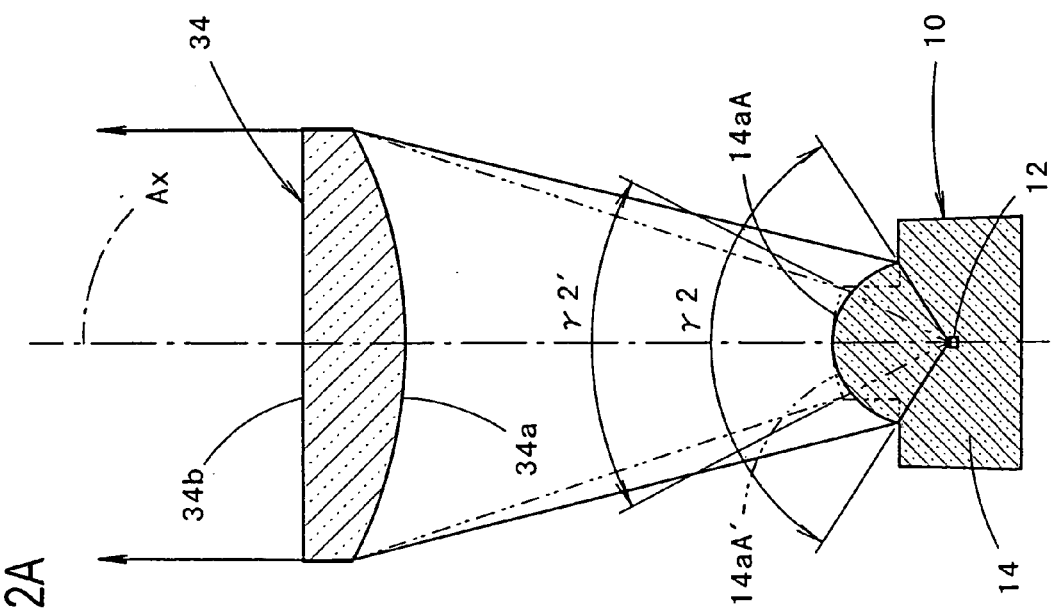

FIG. 12A shows a cross-section taken along the line XIb-XIb in FIG. 2 in the same way as in FIG. 11B, and it is a diagram showing the effects of the outer shape of the curved surface portion 14aA of the sealing member 14 formed in a horizontally bilobal shape that has a transversely narrowed part in the middle in the longitudinal direction of the bilobal shape when viewed from the front.

If it is assumed that the curved surface portion 14aA of the sealing member 14 have a horizontally bilobal shape that extends in the lateral direction with a uniform width in the vertical cross-section which is the same as that in the vertical plane shown in FIG. 11A, then only the light emitted from the light-emitting chip 12 in the direction within the angle range of γ2' (γ2'<γ2) would reach the curved surface portion 14aA' indicated by the line of alternating one long and two short dashes, resulting in that the luminous flux utilization factor with respect to the light emitted from the light-emitting chip 12 is reduced. However, in the shown embodiment, the curved surface portion 14aA of the sealing member 14 is formed so that the outer shape is a horizontally bilobal shape that has a transversely narrowed part in the middle in the longitudinal direction of the bilobal shape. Accordingly, the luminous flux utilization factor with respect to the light emitted from the light-emitting chip 12 improves.

FIG. 12B shows a cross-section taken along the line XIb-XIb in FIG. 2 in the same way as in FIG. 11B, and it is a diagram describing the effects of the convex curve C4, which forms the cross-sectional shape of the cylindrical surface forming the rear face 34a of the inner lens 34 along a vertical plane parallel to the optical axis Ax, with a predetermined curvature that gradually reduces according to the increase in the distance from the optical axis Ax in the lateral direction.

If it is assumed that the above-described convex curve C4 be formed with a uniform curvature as indicated by the line of alternating one long and two short dashes in FIG. 12B, then the cross-sectional shape of the rear face 34a' of the inner lens 34 taken along the vertical plane would match the convex curve that has an increased curvature as if it is created by extending the convex curve C4 in the front-back direction, causing the refracting power to be excessive in the rear face 34a' of the inner lens 34. Accordingly, the light cannot be directed from the inner lens 34 parallel to the optical axis Ax. However, in the shown embodiment, the convex curve C4 is formed with a curvature that gradually reduces according to the increase in the distance from the optical axis Ax in the lateral direction. Accordingly, light to be directed from the inner lens 34 is parallel to the optical axis Ax regardless of where the light is incident on the inner lens 34.

As can be understood from the above, the entire region of the inner lens 34 appears to be illuminated at a substantially uniform luminance when the vehicular lamp 50 of the shown embodiment is observed from a position in front of the lamp in a state in which the light-emitting element 10 is turned on without the outer lens 36. Accordingly, in a state that the outer lens 36 is added to, the entire region of the outer lens 36 appears to be illuminated at a substantially uniform luminance when the vehicular lamp 50 is observed not only from a position just in front of the lamp but also from a side position which is deviated somewhat obliquely from the front position in either the vertical or horizontal direction.

Furthermore, with regard to the inner lens 34, the cylindrical face, which forms the rear face 34a, is formed in a V-shaped cross-sectional shape along the horizontal plane, which gradually extends forward according to the increase in the distance from the optical axis Ax in the lateral direction. Accordingly, light emitted from the light-emitting element 10 is greatly refracted in the direction closer to the optical axis Ax by the rear face 34a of the inner lens 34, allowing the light to be directed from the inner lens 34 in parallel to the optical axis Ax, thus improving the light directing efficiency of the multiple prism-shaped lens elements 34s formed on the front face 34b.

In the above-described vehicular lamp 50, parallel light is diffused in the vertical direction and the lateral direction by the outer lens 36 after the light emitted from the light-emitting element 10 is adjusted so as to be parallel light fluxes. However, other arrangements are possible so that the front face of the inner lens 34 has such a diffusion function as described above while the outer lens 36 has a plain lens function and so that the outer lens 36 is omitted.

In addition, though in the above description the light-emitting chip 12 has a shape of a square with the length of each of the four sides being around 0.3 to 1 mm, other arrangements are possible, and the light-emission chips formed in any other shape (e.g., horizontally long rectangle, etc.) and/or any other size can be employed.

The invention claimed is:

1. A vehicular lamp comprising:
a light-emitting element disposed to face forward on an optical axis which extends in a front-back direction of said vehicular lamp, and
a horizontally elongated lens disposed in front of said light-emitting element; wherein
said light-emitting element is formed so as to direct light thereof with a divergence angle that is greater in a lateral direction than in a vertical direction; and
a rear face of said lens is formed in a shape of a cylindrical surface that extends in a lateral direction of said lens, and a curvature of a convex curve, which forms a cross-sectional shape of the cylindrical surface taken along a vertical plane parallel to the optical axis, is set to be gradually reduced according to an increase of a distance from the optical axis in the lateral direction of said lens.

2. The vehicular lamp according to claim 1, wherein the cross-sectional shape of the cylindrical surface taken along a horizontal plane is set to be a letter-V shape that gradually extends forward according to an increase in a distance from the optical axis in the lateral direction of said lens.

3. The vehicular lamp according to claim 1, wherein said lens is formed on a front face thereof with a plurality of prism-shaped lens elements that direct light from said light-emitting element incident on said lens so as to be deflected toward the optical axis with respect to the lateral direction of said lens.

4. The vehicular lamp according to claim 2, wherein said lens is formed on a front face thereof with a plurality of prism-shaped lens elements that direct light from said light-emitting element incident on said lens so as to be deflected toward the optical axis with respect to the lateral direction of said lens.

* * * * *